United States Patent
Ish-Shalom et al.

(10) Patent No.: US 9,258,015 B2
(45) Date of Patent: Feb. 9, 2016

(54) DECODER WITH SELECTIVE ITERATION SCHEDULING

(71) Applicant: Apple Inc., Cupertino (CA)

(72) Inventors: Tomer Ish-Shalom, Raanana (IL); Ronen Dar, Tel Aviv (IL); Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 192 days.

(21) Appl. No.: 14/138,809

(22) Filed: Dec. 23, 2013

(65) Prior Publication Data

US 2015/0180511 A1 Jun. 25, 2015

(51) Int. Cl.
*H03M 13/00* (2006.01)
*H03M 13/11* (2006.01)
*H03M 13/37* (2006.01)

(52) U.S. Cl.
CPC ........ *H03M 13/1111* (2013.01); *H03M 13/114* (2013.01); *H03M 13/1128* (2013.01); *H03M 13/3715* (2013.01)

(58) Field of Classification Search
CPC .................... H03M 13/1111; H03M 13/3715; H03M 13/114; H03M 13/1128
See application file for complete search history.

(56) References Cited

U.S. PATENT DOCUMENTS

| 6,647,462 | B1* | 11/2003 | Miretsky | G06F 9/3802 710/68 |
|---|---|---|---|---|
| 2006/0061498 | A1* | 3/2006 | Lamy | H03M 7/30 341/67 |
| 2008/0148128 | A1* | 6/2008 | Sharon | H03M 13/1131 714/758 |
| 2008/0256264 | A1* | 10/2008 | Muto | G06F 13/387 710/5 |
| 2010/0262813 | A1* | 10/2010 | Brown | G06F 8/433 712/240 |
| 2011/0246862 | A1* | 10/2011 | Graef | H03M 13/1108 714/785 |
| 2012/0106683 | A1* | 5/2012 | Zhao | H03M 13/2957 375/341 |

OTHER PUBLICATIONS

"Optimized Message Passing Schedules for LDPC Decoding", Predrag Radosavljevic, et al., 2005, pp. 591-595.
"A Generalization of Residual Belief Propagation for Flexible Reduced Complexity LDPC Decoding", Moritz Beermann, Peter Vary, Inst. of Comm. Systems and Data Processing, Sep. 2011, pp. 1-5.
"An Efficient Message-Passing Schedule for LDPC Decoding", Eran Sharon, et al., Sep. 2004, pp. 1-4.
"Efficient Serial Message-Passing Schedules for LDPC Decoding", Eran Sharon, et al., IEEE Transactions on Information Theory, vol. 53, No. 11, Nov. 2007, pp. 4076-4091.
"Convergence Analysis of Serial Message-Passing Schedules for LDPC Decoding", Eran Sharon, et al, Apr. 2006, pp. 1-6.

* cited by examiner

*Primary Examiner* — Guy Lamarre
(74) *Attorney, Agent, or Firm* — Meyertons, Hood, Kivlin, Kowert & Goetzel, P.C.

(57) ABSTRACT

A method includes decoding a code word of an Error Correction Code (ECC), which is representable by a set of check equations, by performing a sequence of iterations, such that each iteration involves processing of multiple variable nodes. For one or more selected variable nodes, a count of the check equations that are defined over one or more variables held respectively by the one or more selected variable nodes is evaluated, and, when the count meets a predefined skipping criterion, the one or more selected variable nodes are omitted from a given iteration in the sequence.

12 Claims, 3 Drawing Sheets

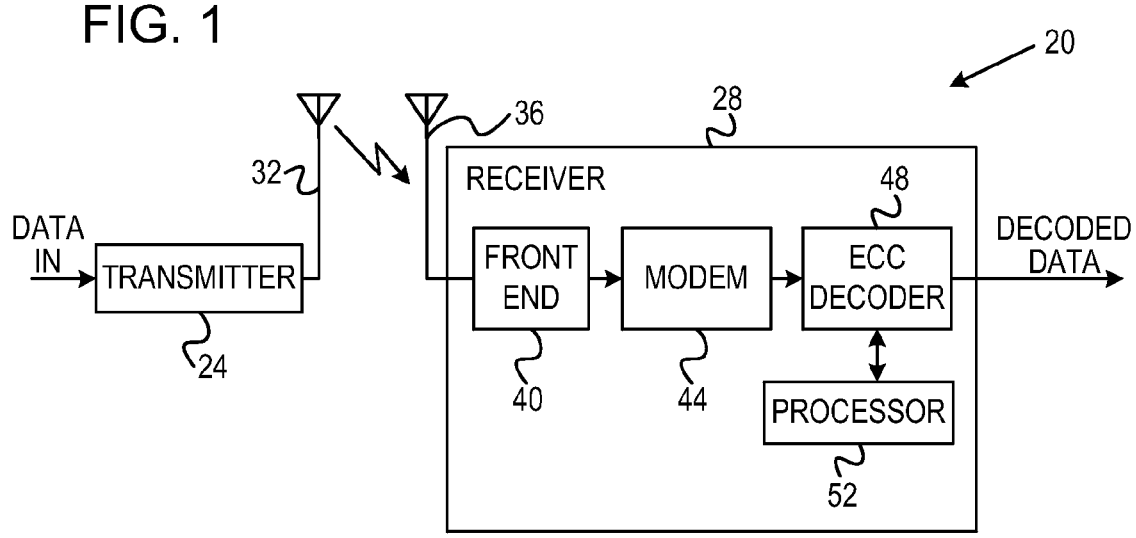
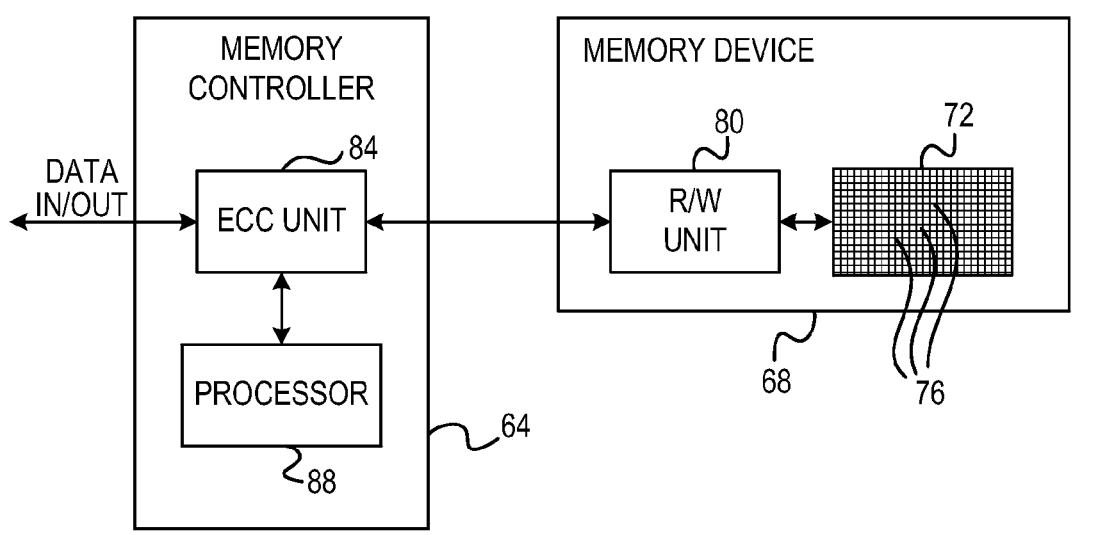

US 9,258,015 B2

DECODER WITH SELECTIVE ITERATION SCHEDULING

FIELD OF THE INVENTION

The present invention relates generally to Error Correction Coding (ECC), and particularly to methods and systems for ECC decoding.

BACKGROUND OF THE INVENTION

Some types of error correction codes, such as Low Density Parity Check (LDPC) codes, are commonly decoded using iterative decoding processes. The intra-order of operations that are performed during decoding iterations is referred to as scheduling. Various scheduling schemes and configurations for iterative decoding are known in the art.

For example, U.S. Pat. No. 8,504,890, whose disclosure is incorporated herein by reference, describes a decoder in which a code word is decoded by receiving a code word representation that includes a plurality of soft bits and iteratively updating the soft bits. Whether each soft bit participates in at least some of the iterations is determined according to a selection criterion, e.g., probabilistically, or according to the iteration number, or according to the soft bit's iteration history. For example, each soft bit might participate in some or all of the iterations with a probability that is a function of both the iteration number and a reliability measure of that soft bit. Preferably, the iterations are LDPC iterations in which variable nodes are addressed sequentially for exchanging messages with corresponding check nodes.

As another example, U.S. Patent Application Publication 2011/0314352, whose disclosure is incorporated herein by reference, describes methods and systems for reduced-complexity decoding of low-density parity-check (LDPC) information. An encoded input stream is received and decoded with one or more reduced-complexity min-sum or a-posteriori probability LDPC decoders. A v-node update rule in the reduced-complexity decoder is omitted.

In "A Generalization of Residual Belief Propagation for Flexible Reduced Complexity LDPC Decoding," Proceedings of the IEEE Vehicular Technology Conference (VTC-Fall), San Francisco, Calif., Sep. 5-8, 2011, which is incorporated herein by reference, Beermann and Vary describe an Informed Dynamic Scheduling method providing different decoding strategies that dynamically decide which messages are passed throughout the decoding process. It was shown that the overall convergence can be sped up considerably and also more errors can be corrected with comparison to other (non-dynamic) decoding strategies. However, these strategies incur significant additional computational complexity in the procedure of selecting the messages to be updated in each decoding step. The authors propose two dynamic decoding strategies that allow for a flexible adaptation of the decoder's dynamics and reduce the additional complexity while maintaining, and in some cases exceeding, the convergence speed and error rate performance of known dynamic schedules.

SUMMARY OF THE INVENTION

An embodiment of the present invention provides a method including decoding a code word of an Error Correction Code (ECC), which is representable by a set of check equations, by performing a sequence of iterations, such that each iteration involves processing of multiple variable nodes. For one or more selected variable nodes, a count of the check equations that are defined over one or more variables held respectively by the one or more selected variable nodes is evaluated, and, when the count meets a predefined skipping criterion, the one or more selected variable nodes are omitted from a given iteration in the sequence.

In some embodiments, the given iteration immediately follows an iteration in which the skipping criterion is met. In other embodiments, evaluating the count includes evaluating a maximal number of unsatisfied check equations among the check equations in which the one or more variables appear, and the skipping criterion specifies recognizing that the maximal number is below a predefined skipping threshold. In yet other embodiments, the one or more variables include binary variables, and performing the iterations includes conditionally flipping the binary variables based on a predefined bit flipping threshold, and including setting the skipping threshold depending on the bit flipping threshold.

In an embodiment, setting the skipping threshold includes subtracting a positive integer from the bit flipping threshold. In another embodiment, the given iteration includes an iteration in which the skipping criterion is met. In yet another embodiment, variables that are associated with one or more selected variable nodes are all common to a predefined subset of the check equations.

There is additionally provided, in accordance with an embodiment of the present invention, apparatus including multiple variable nodes holding respective variables, and logic circuitry. The logic circuitry is configured to decode a code word of an Error Correction Code (ECC), which is representable by a set of check equations, by performing a sequence of iterations such that each iteration involves processing of at least some of the variable nodes, to evaluate, for one or more selected variable nodes, a count of the check equations that are defined over one or more variables held respectively by the one or more selected variable nodes, and, when the count meets a predefined skipping criterion, to omit the one or more selected variable nodes from a given iteration in the sequence.

The present invention will be more fully understood from the following detailed description of the embodiments thereof, taken together with the drawings in which:

BRIEF DESCRIPTION OF THE DRAWINGS

FIG. 1 is a block diagram that schematically illustrates a communication system that uses Error Correction Coding (ECC), in accordance with an embodiment of the present invention;

FIG. 2 is a block diagram that schematically illustrates a memory system that uses Error Correction Coding (ECC), in accordance with an embodiment of the present invention;

DETAILED DESCRIPTION OF EMBODIMENTS

Overview

Figure 3:
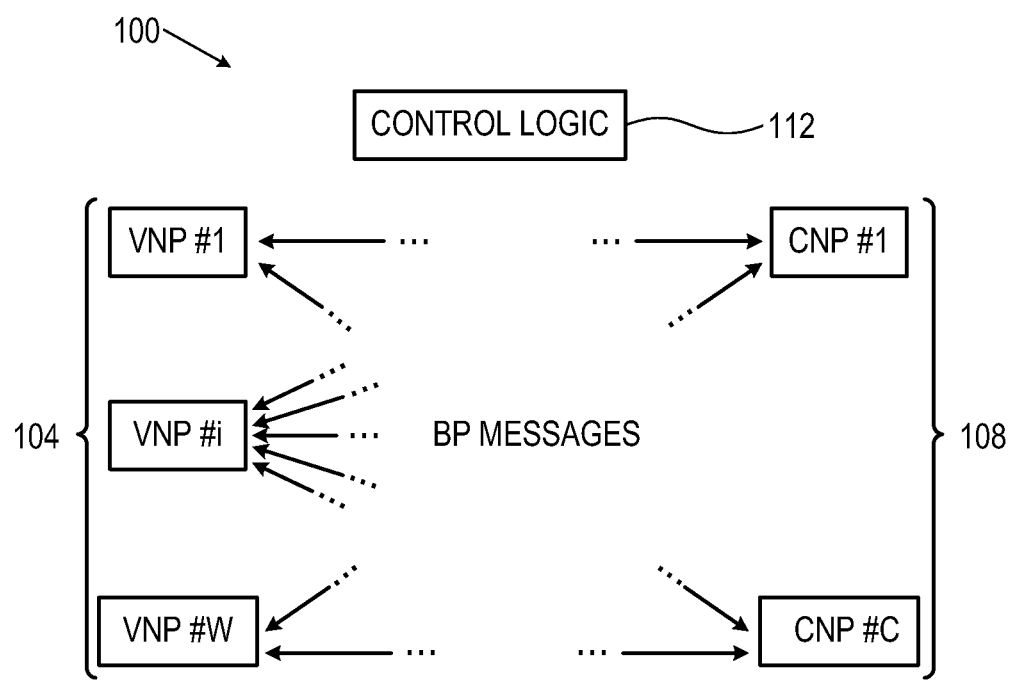
FIG. 3 is a block diagram that schematically illustrates an iterative LDPC decoder, in accordance with an embodiment of the present invention.

Some types of ECC, such as LDPC codes, are represented by multiple check equations that are defined over multiple variables. Some iterative ECC decoders may be represented graphically using multiple check nodes corresponding to the check equations, and multiple variable nodes corresponding to the variables. In the graphical representation, the variable corresponding to a given variable node is connected to the check nodes that correspond to the check equations in which the variable appears.

A decoder of this sort, i.e., a message passing decoder, decodes the ECC by exchanging messages between check nodes and variable nodes that are connected to one another, in an attempt to converge to a state where the variables corresponding to the variable nodes hold a valid code word. The decoder converges to a valid code word when all the check equations representing the ECC are satisfied. The number of check equations in which a given variable appears is also referred to as the degree of that variable. Prior to decoding convergence, it possible that for a given variable, only a partial subset of the check equations in which that variable appears are satisfied.

In some decoding processes, the message sent from a given check node to a given variable node comprises a predefined function that is computed over the most updated messages received at the given check node from the other variable nodes, e.g., during the most recent decoding iteration. (An iteration is defined as a full scan over the check nodes and variable nodes.)

For example, a check node message may comprise an indication of whether the check equation corresponding to this check node is satisfied. (In the description that follows, for the sake of brevity, we sometimes refer to a variable node rather than to the variable corresponding to the node.)

Embodiments of the present invention that are described herein provide improved methods and systems for scheduling the computations carried out for the check and variable nodes that are performed during the decoding iterations. In the context of the present invention, the term "scheduling" refers to the scanning order of the check and variable nodes. In the presented embodiments, scheduling of the variable nodes mainly refer to serial-V scheduling, in which the variable nodes (or groups thereof) are scanned sequentially. In the disclosed embodiments, however, instead of scanning all the variable nodes, certain variable nodes, or groups of variable nodes, may be omitted from a given iteration (i.e., skipping the computations for that variable node, or nodes) based on the number of unsatisfied and satisfied equations in which the variable of that variable node participates. The number of unsatisfied and satisfied check equations in which the variable of the variable node appears serves as a reliability measure of that variable value. For example, omitting a variable node from the next iteration reflects the assessment that outgoing messages that would have been sent from this variable node in the next iteration will not alter the state of the decoder.

In some embodiments, the decoder decides to omit a given variable node from the following iteration, if the respective number of unsatisfied check equations in which the variable of that variable node participates is lower than a predefined skipping threshold. In other embodiments, the variable nodes are partitioned into groups, which are also referred to herein as layers. During a decoding iteration, the layers are scanned sequentially. The decoder decides to omit an entire layer (i.e., to omit all the variable nodes of the layer) from the following iteration if the maximal number of unsatisfied check equations in which the layer variables appear is lower than a predefined skipping threshold.

In an embodiment, the variables of the variable nodes comprise binary variables. The decoder conditionally flips a given binary variable (i.e., changes '0' to '1' and vice versa) based on the number of unsatisfied check equations in which the binary variable appears. For example, the decoder may decide to flip the binary variable when the number of unsatisfied check equations in which that binary variable participates is equal to or higher than a predefined flipping threshold. The decoder can determine the skipping threshold based on the flipping threshold value of the following iteration. For example, if when transitioning to the following iteration, the number of unsatisfied check equations in which the variable participates is expected to change by less than a positive integer X, the decoder calculates the skipping threshold by subtracting X from the flipping threshold of the following iteration. Such threshold setting reflects the assumption that the number of unsatisfied check equations would not change by more than X in the current iteration.

In some embodiments, the code is designed such that a predefined subset of the variables uniquely share a common set of check equations. The variables in this subset are referred to herein as common variables. The common variables correspond to a partial subset of the code word bits or symbols. In such embodiments, when all the check equations in the common set are satisfied, the respective values of the common variables are considered correct. Therefore the variable nodes corresponding to the respective common variables are omitted from the current iteration.

In alternative embodiments, some or all of the common variables are omitted from the current iteration when little or no change is expected in the state of the decoder. For example, the decoder may omit the common variables when the number of unsatisfied check equations in the common set of check equations is lower than the flipping threshold.

In the disclosed techniques, scheduling of the variable nodes includes optional omitting of variable nodes under certain conditions. As a result, the average number of iterations per variable node reduces significantly. The disclosed techniques therefore reduce the power consumption and decoding convergence time. In addition, the techniques typically do not degrade, and may even slightly improve (although in rare cases), the decoding Block Error Rate (BER).

System Description

FIG. 1 is a block diagram that schematically illustrates a wireless communication system 20 that uses error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

FIG. 2 is a block diagram that schematically illustrates a data storage system 60 that uses error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

FIG. 3 is a block diagram that schematically illustrates an iterative LDPC decoder 100, in accordance with an embodiment of the present invention. Decoder 100 can be used to implement decoder 48 of FIG. 1 above, or ECC unit 84 of FIG. 2 above. Decoder 100 accepts as input valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. The ECC decoder decodes the input while attempting to correct these errors, so as to reconstruct the data conveyed in the code words. In a typical implementation, each code word comprises on the order of several hundred to several thousand bits, although any other suitable code word size can be used.

The LDPC code in question is defined by a set of M check equations, which are defined over a set of V variables (e.g., bits for a binary LDPC code). Decoder 100 comprises a set of W Variable Node Processors (VNPs) 104 denoted VNP#1 ... VNP#W, and a set of C Check Node Processors (CNPs) 108 denoted CNP#1 ... CNP#C. Each variable node may be associated with a respective VNP, and each check equation may be associated with a respective CNP.

VNPs 104 and CNPs 108 are connected by arcs (shown as arrows in the figure, in accordance with the structure of the code. The VNP assigned to each variable (or variable node) is connected to the CNPs that are assigned to the check equations (or check node) in which that variable appears. Since the LDPC code is sparse (i.e., the code has a sparse parity check matrix), each CNP is typically connected only to a small subset of the VNPs. In other words, only a small number of variables appear in each of the check equations. As long as the decoder has not yet converged to a valid code word, at least one check equation is still unsatisfied. The number of check equations in which a given variable appears (i.e., the number of arcs connected to the respective variable node for that variable) is referred to as the degree of that variable.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values of the channel output. The VNPs and CNPs exchange messages with one another over the arcs that connect them. Based on the messages received from the CNPs and on the channel output, VNPs may adapt their bit values. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

Decoder 100 further comprises a control logic unit 112 that manages and coordinates the operations carried out by the VNPs and CNPs. For example, among other tasks, control logic 112 manages the scheduling of the variable and check nodes.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including VNPs 104, CNPs 108, and control logic 112) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

In the context of the present patent application and in the claims, the term "logic circuitry" collectively refers to VNPs 104, CNPs 108, and control logic 112.

Check and Variable Nodes Operation and Scheduling

In some embodiments, the iterative decoding process scans variable and check nodes, or groups thereof sequentially in some scheduling order. A full scan over the variable and check nodes is referred to herein as a decoding iteration, or simply "iteration" for brevity. An example of an iterative process of this sort is described in the paper by Cui et al., in "Efficient Decoder Design for High-Throughput LDPC decoding," IEEE Asia Pacific Conference on Circuits and Systems, November, 2008, which is incorporated herein by reference. Alternatively, any other suitable process can be used.

Based on the code structure and decoding scheduling, each CNP sends messages to its connected VNPs and receives messages from its connected VNPs. The message value sent from a given CNP to a given VNP comprises a predefined CNP function computed over the respective CNP state and the VNP messages received by that CNP.

CNPs 108 can use any suitable function to compute the message value to be sent to each of its connected VNPs. When decoder 100 is configured to extrinsic message passing decoding, the CNP function may comprise, for example the "product-sum" or "min-sum" function, or approximations thereof. When decoder 100 is configured to perform bit flipping decoding, the CNPs function comprises a parity-check sum function (also referred to as a syndrome calculation function), which is related to the check equations. When decoder 100 is configured to a-posteriori message passing decoding, the CNP messages sent to a given variable node may be computed as a function of the messages received from that variable node.

Similarly, when the turn of each variable node arrives, the respective VNP receives messages from its connected CNPs and sends to these CNPs updated messages. The message value sent from a given VNP to a given CNP comprises a predefined VNP function computed over the incoming CNP messages and the VNP state. The set of messages typically comprises the most updated messages received in the given VNP from the CNPs other than the given CNP, e.g., during the most recent decoding iteration.

VNPs 104 can use any suitable VNP function for calculating the message value to be sent to its connected CNPs. In some embodiments, decoder 100 comprises an extrinsic message passing decoder, and the VNP function comprises, for example, the summation of all the incoming messages sent from the target check node. In alternative embodiments, decoder 100 comprises an a-posteriori message passing decoder, and the VNP function computes, for example, the summation of all the incoming messages. In further alternative embodiments, decoder 100 comprises a bit flipping decoder, and the VNP function comprises evaluating the VNP bit value, for example, by conditionally flipping the bit value based on the number of the unsatisfied check equations in which the bit value appears.

Upon receiving a new message from a given VNP, the CNP typically replaces the previous message received from this VNP, and re-evaluates its state to reflect the newly-received message. VNPs update similarly upon receiving the CNPs messages.

Scheduling with Conditional Skipping of Variable Nodes

In the description that follows, logic 112 of decoder 100 manages the scheduling or scanning order the variable and check nodes. In the present example, an outer loop scans the variable nodes and an inner loop scans the check nodes connected to each scanned variable node. (This scheduling order is sometimes referred to as "serial V" or "column-layered". In alternative embodiments, the outer loop scans the check nodes and the inner loop scans the variable nodes for the currently-scanned check node. The latter scheduling order is sometimes referred to as "serial C" or row-layered. Hybrid scheduling orders are also feasible.

In some embodiments, the variables are partitioned into groups that are referred to as variable layers, or simply layers for brevity. The variables in a given variable layer may be processed in any suitable order. For example, independent variables may be processed concurrently, or in any desired order, since they are independent of one another. The term "independent variables" in this context means that they do not appear together in any check equation. A group of variables is said to be independent if every pair of variables in the group is independent. The variable layers are typically processed sequentially, since variables in different layers may depend on one another.

Figure 4:
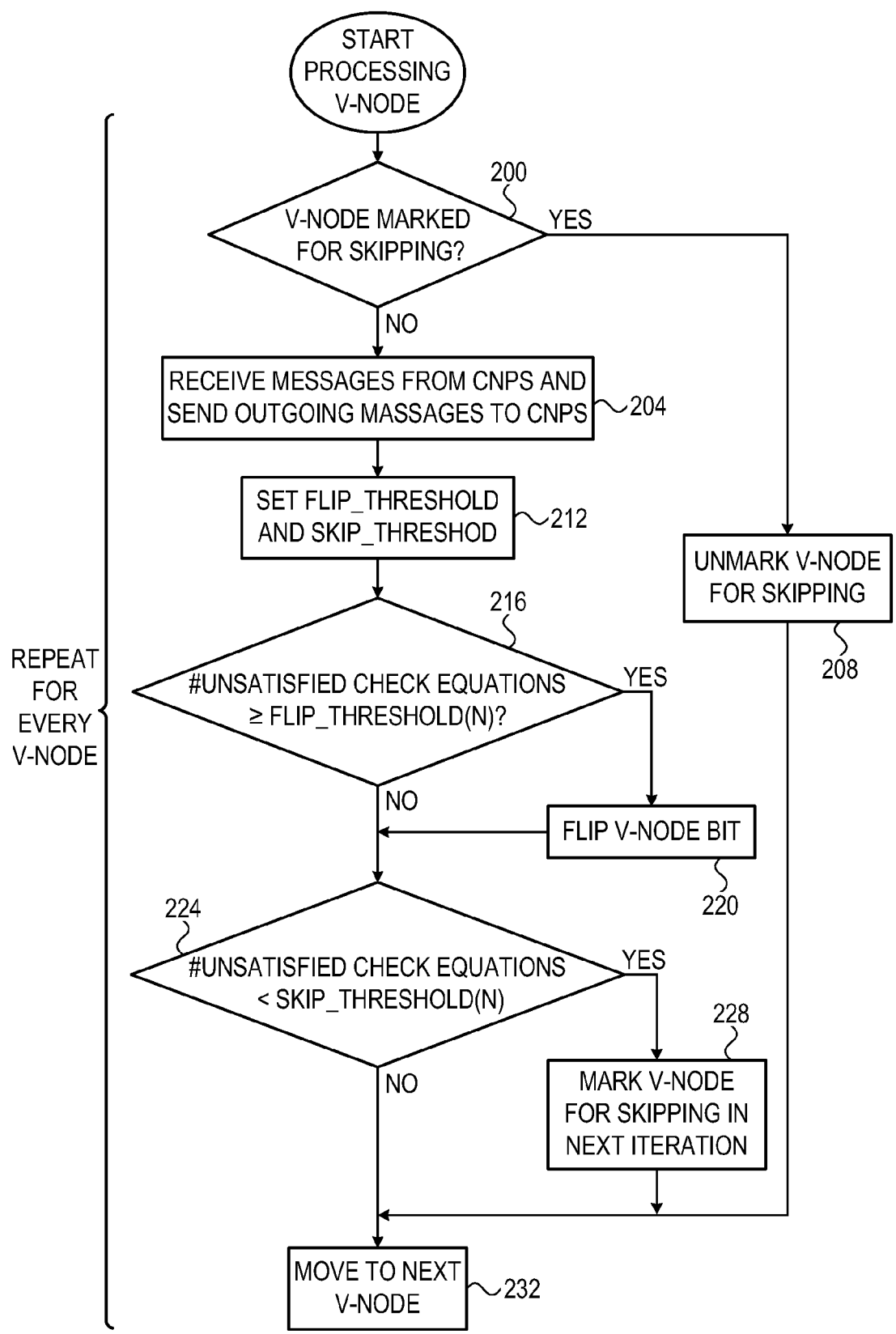
FIG. 4 is a flow chart that schematically illustrates a method for scanning variable nodes with conditional node skipping, in accordance with an embodiment of the present invention.

FIG. 4 is a flow chart that schematically illustrates a method for scanning variable nodes with conditional node skipping, in accordance with an embodiment of the present invention. The method is applicable for both variable nodes and variable layers. In the scenario described in FIG. 4, the decoder runs the $N^{th}$ (current) decoding iteration. In the figure, v-node denotes a variable node or a group of variable nodes, such as processed by VNP 104, to which the scheduling has arrived. In some embodiments, the processing among the VNPs is performed in parallel. In the description that follows, we use the terms v-node, and variable interchangeably. In the method of FIG. 4, control logic 112 is assumed to handle a default scheduling of the variable nodes. Each v-node, however, may omit itself from the default scheduling by skipping the internal operations of the v-node. In alternative embodiments, logic 112 receives check equations results from the CNPs and manages the scheduling of the variable nodes including the conditional v-node skipping.

The method begins with VNP 104 checking whether the currently scanned v-node is marked for skipping, in a v-node mark checking step 200. The v-node may have been marked for skipping in the previous iteration (the $N-1^{th}$) as described at step 228 below. Note that at time of iteration initialization, all the v-nodes are configured as unmarked for skipping (not shown in the figure.) If the v-node at step 200 is found marked for skipping, the v-node clears the skipping mark, at an unmarking step 208, and control logic 112 moves to the next v-node according to the default schedule, at a v-node transition step 232. Since unmarking a given v-node at step 208 results in a negative outcome at step 200 in the following iteration, the unmarked v-node should be processed in the following iteration. In other words, the method avoids omitting the same v-node in two or more consecutive iterations. In an embodiment, control logic 112 may skip a group of multiple v-nodes that are all marked for skipping and are scheduled consecutively under the default scheduling.

If at step 200 above, the v-node is found unmarked, VNP 104 proceeds to input/output step 204. At step 204, VNP 104 receives CNP messages from its connected CNPs and calculates and sends respective VNP messages to its connected CNPs. In the present example we assume that each CNP message comprises an indication of whether the check equation that is associated with this CNP is satisfied. VNP 104 thus evaluates for the currently scanned v-node the number of unsatisfied check equations among its associated check nodes. When VNP 104 processes a group of multiple v-nodes, the VNP evaluates the number of unsatisfied check equations for each v-node in the group.

At a thresholds setting step 212, VNP 104 sets a flipping threshold FLIP_THRESHOLD and a skipping threshold SKIP_THRESHOLD. The decoder may use any suitable method to determine the values of the flip and skip thresholds. Each of the two threshold values may be static or alternatively change, for example, as a function of the iteration index and the degree of the variable. In some embodiments, the threshold values may additionally depend on calculations performed in previous decoding iterations.

In some embodiments, the threshold values adapt at a finer or coarser resolution than decoding iteration. For example, the threshold value may adapt after scanning a predefined number of variable nodes, or variable layers. As another example, a coarse and irregular adaptation scheme may adapt the threshold values after scanning, one and a half iterations, and then adapt the threshold values again after scanning two variable layers. The adaptation sequence of the flipping and/or skipping threshold values may be implemented and stored in a predefined table. Alternatively, the decoder may estimate the threshold values on the fly. In some embodiments, the decoder determines the flipping threshold value at step 212 for both the current and the next iterations, to be used at steps 216 and 224 below.

At a flipping decision step 216, the v-node checks whether the number of unsatisfied check equations in which the variable appears is not lower than the flipping threshold of the current iteration, FLIP_THRESHOLD(N). If the result at step 216 is positive, the v-node flips the binary value of the v-node, at a flipping step 220.

In some embodiments, the VNP estimates the probability that the binary value of a given variable should be flipped in the following iteration, for example, based on the maximal number of unsatisfied check equations in which the given variable participates. When the estimated probability of flipping is low, it will be advantageous to skip the v-node processing in the next iteration. At a v-node skip checking step 224, the decoder checks whether the number of unsatisfied check equations in which the variable participates is below the skipping threshold, SKIP_THRESHOLD(N). When processing a group of variable nodes, the condition at step 224 should hold for each of the variables in the group. Equivalently, the maximal number of unsatisfied equations among the variable in the group should be below the skipping threshold.

Alternatively, the skipping condition may require that the number of unsatisfied check equations in which the variables of the layer v-nodes appear should be lower than the skipping threshold for only a partial subset of the layer v-nodes. Further alternatively, the skip condition may compare the total or average number of unsatisfied check equations in which the variables of the layer v-nodes appear to the skipping threshold.

If the result at step 224 is positive, the decoder marks the respective v-node (or v-nodes) for skipping in the next iteration, at a marking step 228. Note that marking a given v-node at step 228 in some iteration, will result in a positive outcome at step 200 when the schedule arrives at the same v-node in the following iteration, causing the v-node to be skipped.

In an embodiment, the skipping threshold in the current iteration depends on the flipping threshold of the next iteration. For example, the current skipping threshold may be set strictly lower than the flipping threshold of the next iteration. When, for example, the number of unsatisfied check equations in which the variable participates is expected to reduce or to increase by less than a positive integer X, it would be safe to set SKIP_THRESHOLD(N)=FLIP_THRESHOLD(N+1)−X (at step 212 above). Note that even if the number of unsatisfied check equations in which the variable of the v-node appears would have increased by more than X, thus causing bit flipping in the following iteration, in many occasions such temporal increase would create a false flipping. Thus, skipping potential false flipping improves the probability of successful decoding and reduces the decoding convergence time.

Following step 228, or step 224 when the result is negative, control logic 112 transitions to the next v-node, at step 232, according to the default schedule. In alternative embodiments, control logic 112 may skip a group of multiple v-nodes that are all marked for skipping and are scheduled consecutively under the default scheduling.

The configuration described in the method of FIG. 4 is an exemplary configuration and other suitable configurations can also be used. For example, by using the same threshold value at steps 216 and 224, the v-node may either perform bit flipping or mark the v-node for skipping, but not both in the same iteration. Such temporal setting may enable to perform skipping only in selected iterations, such as, for example, during the first iterations (whose number is predefined or determined on the fly).

Simulations conducted by the authors demonstrate an average reduction of 30 percent in the number of LDPC decoding iterations when the method of FIG. 4 is applied with X=2 over a signal to noise ratio (SNR) range between 9.0 and 9.7 dB. The simulations additionally result in a slight improvement in the Frame Error Rate (FER).

In some embodiments, the ECC is designed so that the variables in a predefined subset (corresponding to respective variable nodes, or layers) uniquely share a set of common check equations. In other words, these variable nodes have all their check node connections contained in the set of common check equations. The variables in this subset are referred to herein as common variables. The common variables can be viewed as corresponding to a partial subset of the code word variables. In such embodiments, when all the check equations of the common set are satisfied, the values of the common variables are assumed to be correct, and some or all of the respective variable nodes are omitted from the current iteration.

In alternative embodiments, some or all of the common variables are omitted from the current iteration when no change, or only a small change, is expected in the decoder state. For example, the control logic may omit one or more of the common variables when the number of unsatisfied check equations in the respective common set of check equations is lower than the flipping threshold.

The configurations in the methods described above are exemplary configurations and other suitable configurations can also be used. For example, in some embodiments, one or more v-nodes are configured as individual v-nodes whereas others belong to one or more variable layers. In such embodiments, the method of FIG. 4 can jointly support both individual variable nodes and variable layers.

The disclosed techniques that are described above refer mainly to hard LDPC decoding. In alternative embodiments, however, similar techniques may be applied to soft LDPC decoding.

Although the embodiments described herein mainly address binary LDPC decoding with selective variable node scheduling, the methods and systems described herein can also be used in other applications, such as in non-binary LDPC and/or other iteratively decodable codes.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    decoding a code word of an Error Correction Code (ECC) by performing a sequence of iterations, such that each iteration involves processing of multiple variable nodes, wherein the ECC is represented by a set of check equations;
    for one or more selected variable node processors, evaluating a number of unsatisfied check equations that are defined over one or more variables held respectively by the one or more selected variable node processors, and, omitting the one or more selected variable node processors from a given iteration in the sequence in response to determining that the number of unsatisfied check equations meets a predefined skipping criterion; and
    clearing an indication that a particular variable node processor should be skipped in a current iteration in response to a determining that the particular variable node processor was skipped in a previous iteration.

2. The method according to claim 1, wherein the given iteration immediately follows an iteration in which the skipping criterion is met.

3. The method according to claim 1, wherein the one or more variables includes binary variables, and wherein performing the iterations includes conditionally flipping the binary variables based on a predefined bit flipping threshold, and comprising setting the skipping threshold depending on the bit flipping threshold.

4. The method according to claim 3, wherein setting the skipping threshold comprises subtracting a positive integer from the bit flipping threshold.

5. The method according to claim 1, wherein the given iteration includes an iteration in which the skipping criterion is met.

6. The method according to claim 5, wherein variables that are associated with one or more selected variable node processors, are all common to a predefined subset of the check equations.

7. A decoder, comprising:
    multiple variable node processors, each holding respective variables; and
    logic circuitry, configured to:
        decode a code word of an Error Correction Code (ECC), wherein the ECC is represented by a set of check equations;
        evaluate, for one or more selected variable nodes, a number of unsatisfied check equations that are defined over one or more variables held respectively by the one or more selected variable node processors and
        omit the one or more selected variable node processors from a given iteration in the sequence in response to a determination that the number of unsatisfied check equations meets a predefined skipping criterion;
    wherein to decode the code word of the ECC, the logic circuitry is further configured to perform a sequence of iterations, wherein each iteration includes processing at least some of the multiple variable nodes; and
    wherein the logic circuitry is further configured to clear an indication that a particular variable node processor should be skipped in a current iteration in response to a determination that the particular variable node processor was skipped in a previous iteration.

8. The decoder according to claim 7, wherein the given iteration immediately follows an iteration in which the skipping criterion is met.

9. The decoder according to claim 7, wherein the one or more variables include binary variables, and wherein to perform the sequence of iterations, the logic circuitry is further configured to flip the binary variables based on a predefined bit flipping threshold, and set the skipping threshold depending on the bit flipping threshold.

10. The decoder according to claim 9, wherein to set the skipping threshold, the logic circuitry is further configured to subtract a positive integer from the bit flipping threshold.

11. The decoder according to claim 7, wherein the given iteration includes an iteration in which the skipping criterion is met.

12. The decoder according to claim 11, wherein variables that are associated with one or more selected variable node processors, are all common to a predefined subset of the set of check equations.

* * * * *